United States Patent
Wang

[19]

[11] Patent Number: 6,060,347
[45] Date of Patent: May 9, 2000

[54] METHOD FOR PREVENTING DAMAGE TO GATE OXIDE FROM WELL IN COMPLEMENTARY METAL-OXIDE SEMICONDUCTOR

[75] Inventor: Mu-Chun Wang, Hsinchu Hsien, Taiwan

[73] Assignee: United Microelectronics Corp., Hsinchu, Taiwan

[21] Appl. No.: 09/139,445

[22] Filed: Aug. 25, 1998

[30] Foreign Application Priority Data

Jun. 11, 1998 [TW] Taiwan ................... 87109285

[51] Int. Cl.⁷ ................................ H01L 21/8238
[52] U.S. Cl. .................... 438/215; 438/666; 438/675; 438/189
[58] Field of Search .................... 438/215, 666, 438/675, 189, 621

[56] References Cited

U.S. PATENT DOCUMENTS

| | | | |
|---|---|---|---|
| 5,350,710 | 9/1994 | Hong et al. ................. | 438/189 |
| 5,393,701 | 2/1995 | Ko et al. ................... | 438/189 |
| 5,514,623 | 5/1996 | Ko et al. ................... | 438/189 |
| 5,650,745 | 7/1997 | Merrlii et al. ............. | 438/189 |
| 5,817,577 | 10/1998 | Ko ........................... | 438/694 |

FOREIGN PATENT DOCUMENTS 322628  12/1997  Taiwan ................ H01L 23/522

*Primary Examiner*—Charles Bowers
*Assistant Examiner*—David S Blum
*Attorney, Agent, or Firm*—Thomas, Kayden, Horstemeyer & Risley

[57] ABSTRACT

A method for preventing damage to a gate oxide layer from a floating well in a CMOS device includes a first via plug and a second via plug formed in a dielectric layer. The first via plug is coupled to a substrate and the second via plug is coupled to the well. These two via plugs are further coupled by a conductive bridge so that both the well and the substrate have the same voltage.

16 Claims, 1 Drawing Sheet

METHOD FOR PREVENTING DAMAGE TO GATE OXIDE FROM WELL IN COMPLEMENTARY METAL-OXIDE SEMICONDUCTOR

CROSS-REFERENCE TO RELATED APPLICATION

This application claims the priority benefit of Taiwan application Ser. No. 87109285, filed Jun. 11, 1998, the full disclosure of which is incorporated herein by reference.

BACKGROUND OF THE INVENTION

1. Field of the Invention

This invention relates to a method for preventing damage to an integrated circuit from occurring, and more particularly to a method for preventing damage to a gate oxide layer from a well in a complementary metal-oxide semiconductor (CMOS) device, during a plasma fabrication process.

2. Description of Related Art

In the current process for fabricating an integrated circuit (IC) device, each fabrication process may cause an accumulation of static charges in the integrated circuit device. When the accumulated static charges exceed a certain level, the IC device may be damaged without being noticed. This can also cause, for example, an electrical property shift, a decrease in production rate, or a deterioration of reliability.

The static charges usually accumulate at a bonding pad region. As the accumulated static charges exceed a tolerance, the static charges may break the gate oxide layer and cause damage to it. The reason why the static charges accumulate on the bonding pad region is that the bonding pad region is a good conductor with a large area behaving like a large antenna, which can easily accumulate static charges. It is more obvious for a plasma process, which is widely used for purposes of, for example, etching, removing photoresist, or depositing insulating layer. The accumulated static charges drift to a transistor gate through interconnect metal lines. Since the gate is usually enclosed by an insulating layer, the accumulated static charges cannot drift away and result in damaging the gate oxide layer. The reliability and properties of the device are therefore affected. As the accumulated static charges exceed a certain level, the gate oxide layer may breakdown and the device is further damaged. This phenomenon is called an antenna effect.

In a CMOS device, there is an N(P)-type well on a P(N)-type substrate. During a plasma-related process, the substrate is grounded so that there is no bias on the CMOS device but the N(P) well is in a floating state. The floating well very easily accumulates static charges, which may break the gate oxide layer.

SUMMARY OF THE INVENTION

It is therefore an objective of the present invention to provide a method for preventing damage to a gate oxide layer from a floating well in a CMOS device, during a plasma-related process. The objective is achieved by preventing the well from floating so that the well does not accumulate static charges which would damage the gate oxide layer.

In accordance with the foregoing and other objectives of the present invention, a method for preventing damage to a gate oxide layer from a well in a CMOS device includes a first via plug and a second via plug formed in a dielectric layer. The first via plug is coupled to a substrate and the second via plug is coupled to the well. These two via plugs are further coupled by a conductive bridge so that both the well and the substrate have the same voltage. In this manner, during a plasma related process, the well is not floating with respect to the substrate so that the gate oxide layer is not affected.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
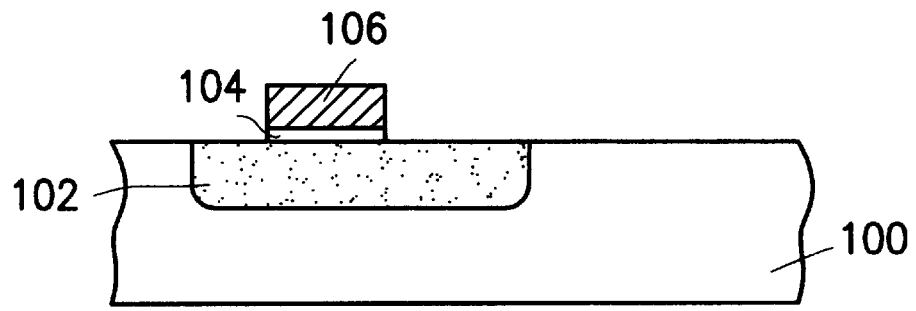
FIGS. 1A–1C are cross-sectional views schematically illustrating a fabrication flow of a CMOS device, including prevention of a floating well, according to a preferred embodiment of the invention.
Figure 1B:
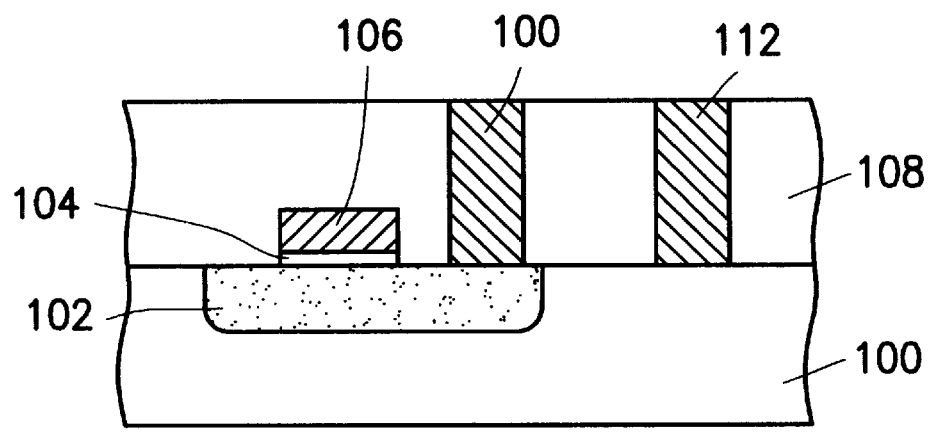
Figure 1C:
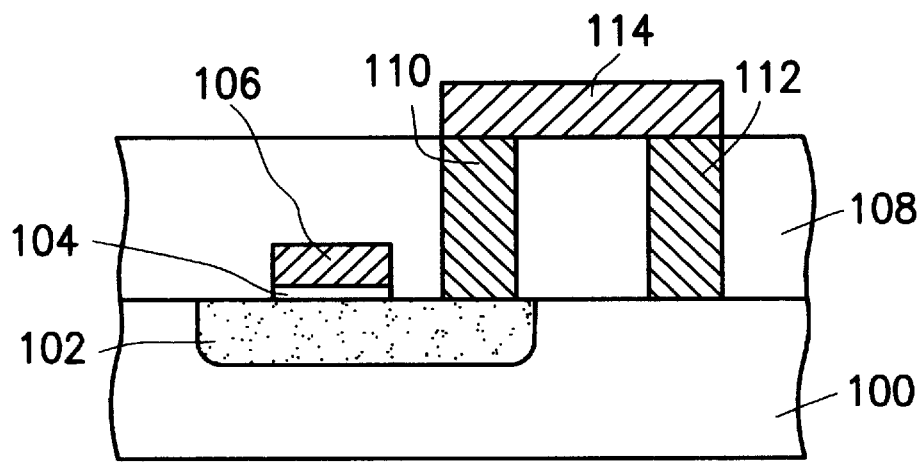

FIGS. 1A–1C are cross-sectional views schematically illustrating a fabrication flow of a CMOS device, including prevention of a floating well, according to a preferred embodiment of the invention. In FIG. 1A, an N(P)-type well 102 is formed in a P(N)-type semiconductor substrate 100, in which the well 102 is opposite in type to the substrate 100. A gate oxide layer 104 is formed over the well 102 and a gate 106 is formed over the gate oxide layer 104. This stage is conventional.

In FIG. 1B, a dielectric layer 108 including, for example, silicon oxide is formed over the substrate 100. A via plug 110 contacting the well 102 and a via plug 112 contacting the substrate 100 are formed by patterning the dielectric layer 108 to form the necessary via openings and filling the via openings with, for example, metallic material or polysilicon.

In FIG. 1C, a metal bridge 114 is formed over the dielectric layer 108 so that the via plugs 110, 112 are electrically coupled. The metal bridge 114 can be formed by, for example, depositing a metal layer (not shown) over the substrate 100 and pattering the metal layer by photolithography and etching to form it. The metal bridge 114 includes, for example, polysilicon.

Since the via plugs 110, 112 are electrically coupled through the metal bridge 114, the well 102 is electrically coupled to the substrate 100 without being a floating well, in which the substrate 100 is usually grounded during a plasma process. The well 102 therefore does not accumulate static charges created by a plasma-related process to cause damage to the gate oxide layer 104. This CMOS structure of the invention also excludes a possibility induced by plasma processes once damage occurs on the gate oxide. The formation of the via plugs 110, 112 and the metal bridge 114 can be easily achieved by current technologies without extra difficulty.

In conclusion, the method of the invention has several characteristics as follows:

1. The invention prevents a floating well from occurring in a CMOS device through the via plugs 110, 112 and a metal bridge 114. Since the well 102 is electrically coupled to the substrate 100, the well 102 does not accumulate static charges to damage the gate oxide layer 104.

2. The possibility of damage due to plasma processes can be excluded when damage occurs on the gate oxide layer.

3. It does not cause extra difficulty for formation.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for preventing damage to a gate oxide layer from a well in a complementary metal-oxide semiconductor (CMOS) device, wherein the CMOS device comprises a well in a semiconductor substrate with opposite doped type, a gate oxide layer on the well, and a gate on the gate oxide layer, the method comprising:

forming a dielectric layer over the substrate;

forming a first via plug and a second via plug in the dielectric layer, in which the first via plug is electrically coupled to the well, and the second via plug is electrically coupled to the substrate; and forming a metal bridge over the dielectric layer so as to let the first via plug and the second plug be electrically coupled together.

2. The method of claim 1, wherein the dielectric layer comprises silicon oxide.

3. The method of claim 1, wherein the first via plug and the second via plug comprise polysilicon.

4. The method of claim 1, wherein the first via plug and the second via plug comprise a metallic material.

5. The method of claim 1, wherein the metal bridge comprises polysilicon.

6. The method of claim 1, wherein the metal bridge comprises a metallic material.

7. The method of claim 1, wherein the step of forming the first via plug and the second via plug comprises:

forming two openings by photolithography and etching; and filling the openings with a conductive material.

8. The method of claim 1, wherein the step of forming the metal bridge further comprises:

forming a metal layer over the substrate;

removing a portion of the metal layer by photolithography and etching, wherein the residual metal layer is the metal bridge to be electrically coupled to the first via plug and the second via plug.

9. A method for preventing damage to a gate oxide layer from a well in a complementary metal-oxide semiconductor (CMOS) device, the method comprising:

forming a well in a semiconductor substrate with opposite doped type;

forming a gate oxide layer over the well;

forming a gate over the gate oxide layer;

forming a dielectric layer over the substrate;

forming a first via plug and a second via plug in the dielectric layer, in which the first via plug is electrically coupled to the well, and the second via plug is electrically coupled to the substrate; and forming a metal bridge over the dielectric layer so as to let the first via plug and the second plug be electrically coupled together.

10. The method of claim 9, wherein the dielectric layer comprises silicon oxide.

11. The method of claim 9, wherein the first via plug and the second via plug comprise polysilicon.

12. The method of claim 9, wherein the first via plug and the second via plug comprise a metallic material.

13. The method of claim 9, wherein the metal bridge comprises polysilicon.

14. The method of claim 9, wherein the metal bridge comprises a metallic material.

15. The method of claim 9, wherein the step of forming the first via plug and the second via plug comprises:

forming two openings by photolithography and etching; and filling the openings with a conductive material.

16. The method of claim 9, wherein the step of forming the metal bridge further comprises:

forming a metal layer over the substrate;

removing a portion of the metal layer by photolithography and etching, wherein the residual metal layer is the metal bridge to be electrically coupled to the first via plug and the second via plug.

* * * * *